United States Patent
Kostelac et al.

(10) Patent No.: US 11,949,546 B2
(45) Date of Patent: Apr. 2, 2024

(54) HARMONIC FILTERS FOR POLAR MODULATORS

(71) Applicant: Eridan Communications, Inc., Mountain View, CA (US)

(72) Inventors: Fran Kostelac, Zagreb (HR); Ante Brizić, Hrastina Samoborska (HR); Dubravko Babić, Milpitas, CA (US)

(73) Assignee: Eridan Communications, Inc., Sunnyvale, CA (US)

( * ) Notice: Subject to any disclaimer, the term of this patent is extended or adjusted under 35 U.S.C. 154(b) by 0 days.

(21) Appl. No.: 17/804,626

(22) Filed: May 31, 2022

(65) Prior Publication Data
US 2022/0393931 A1    Dec. 8, 2022

Related U.S. Application Data

(60) Provisional application No. 63/208,430, filed on Jun. 8, 2021.

(51) Int. Cl.
| | | |
|---|---|---|
| H04L 27/36 | (2006.01) | |
| H03F 3/217 | (2006.01) | |
| H03F 3/24 | (2006.01) | |
| H04L 27/04 | (2006.01) | |

(52) U.S. Cl.
CPC ........... *H04L 27/361* (2013.01); *H03F 3/217* (2013.01); *H03F 3/245* (2013.01); *H04L 27/04* (2013.01); *H03F 2200/451* (2013.01)

(58) Field of Classification Search
CPC ....... H04L 27/361; H04L 27/04; H03F 3/217; H03F 3/245; H03F 2200/451

USPC .......................................................... 375/295
See application file for complete search history.

(56) References Cited

U.S. PATENT DOCUMENTS

| | | | |
|---|---|---|---|
| 8,392,495 B2 | 3/2013 | Morgan | |
| 9,490,756 B1 | 11/2016 | Babic | |
| 9,641,141 B1* | 5/2017 | Zheng | .................. H03F 3/2171 |
| 9,705,467 B2 | 6/2017 | Morgan | |
| 9,837,694 B2 | 12/2017 | Tanaka et al. | |
| 9,859,867 B2 | 1/2018 | Westmoreland | |
| 2009/0134953 A1* | 5/2009 | Hunt | ...................... H01P 1/184 |
| | | | 333/168 |

(Continued)

OTHER PUBLICATIONS

Brizic et al, "Constant Resistance Filters with Diplexer Architecture for S-band Applications" 2019 42nd International Convention on Information and Communication Technology, Electronics and Mircoelectronics (MIPRO), 2019, pp. 76-81 (Year: 2019).*

(Continued)

*Primary Examiner* — Kevin M Burd
(74) *Attorney, Agent, or Firm* — Patent Law Professionals, P.C.; William E. Winters

(57) ABSTRACT

A modulated RF carrier produced at the output of the polar transmitter's switch-mode power amplifier (SMPA) is conveyed to an output filter network comprising a harmonic low-pass filter (LPF) connected in parallel with an absorptive high-pass filter (HPF). Together the harmonic LPF and absorptive HPF pass the fundamental component of the modulated RF carrier to the polar transmitter's load while also absorbing higher harmonic components that would otherwise be undesirably reflected back toward the output of the SMPA.

30 Claims, 4 Drawing Sheets

(56) References Cited

U.S. PATENT DOCUMENTS

2017/0285695 A1* 10/2017 Nair .................. H03H 9/542
2021/0058035 A1    2/2021 Godycki

OTHER PUBLICATIONS

Thilagam et al., "Realization of Butterworth Low Pass Filter Design in Microstrip," International Journal of Innovative Technology and Exploring Engineering (IJITEE), pp. 213-217, vol. 8, issue 4S2, Mar. 2019. (Year: 2019).*

Faucheur et al. "Study of Human Outdoor Walking with a Low Cost GPS and Simple Spreadsheet Analysis," Official Journal of the American College of Sports Medicene, pp. 1570-1578 (2007) (Year: 2007).*

WIPO/ISA, International Search Report (ISR) and Written Opinion (WO) from Int'l Appl. No. PCT/US22/31549.

G. Moloudian et al., "A Microstrip Lowpass Filter With Wide Tuning Range and Sharp Roll-Off Response," IEEE Transactions on Circuits and Systems II: Express Briefs, pp. 2953-2957, vol. 67, issue 12, Dec. 2020.

S. Thilagam et al., "Realization of Butterworth Low Pass Filter Design in Microstrip," International Journal of Innovative Technology and Exploring Engineering (IJITEE), pp. 213-217, vol. 8, issue 4S2, Mar. 2019.

A. Faucheur et al., "Study of Human Outdoor Walking with a Low-Cost GPS and Simple Spreadsheet Analysis," Official Journal of the American College of Sports Medicine, pp. 1570-1578 (2007).

A. Brizić, "Switch-mode radiofrequency amplifiers with complementary filters," 2019, graduate thesis, Faculty of Electrical Engineering and Computing, Zagreb.

A. Brizić and D. Babić, "Constant-resistance filters with diplexer architecture for S-band applications," 2019 42nd International Convention on Information and Communication Technology, Electronics and Microelectronics (MIPRO), 2019, pp. 76-81.

* cited by examiner

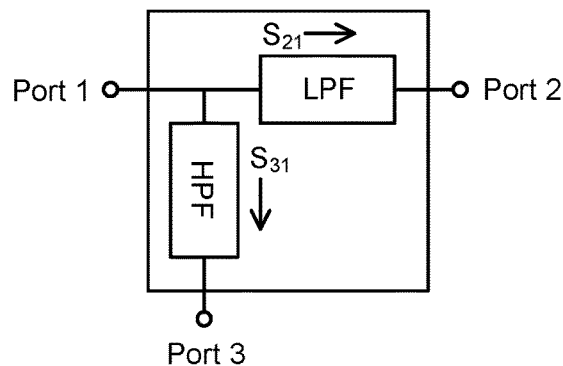
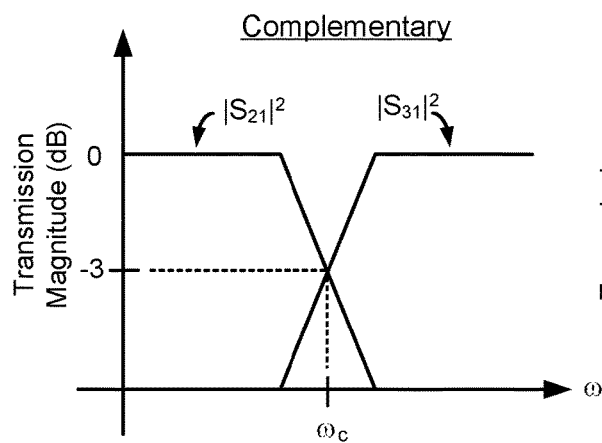
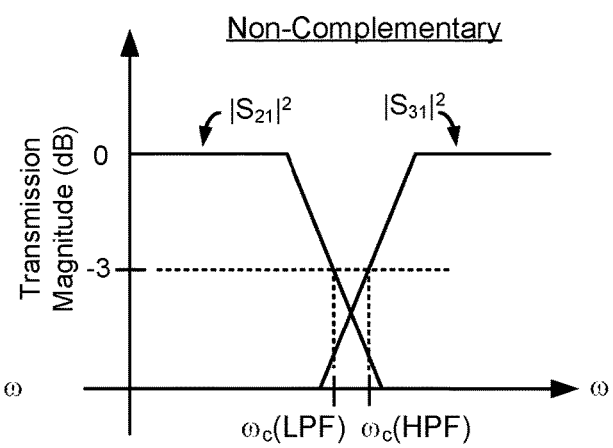
**FIGURE 7
(Prior Art)**
FIGURE 8

HARMONIC FILTERS FOR POLAR MODULATORS

CROSS-REFERENCE TO RELATED APPLICATIONS

This application claims the benefit of U.S. Provisional Patent Application No. 63/208,430, filed Jun. 8, 2021.

BACKGROUND OF THE INVENTION

One of the principal functions of a radio frequency (RF) transmitter is to translate its RF carrier to higher RF power, so that the RF carrier can then be radiated over the air and successfully received by a remote receiver. Translating (i.e., 'amplifying') the RF carrier to higher RF power is the responsibility of the RF transmitter's power amplifier (PA). Because the PA is most often the component of the RF transmitter that consumes the most energy, an important goal usually involved in the design of a PA is to make it operate as efficiently as possible. This goal is especially important in circumstances where the power supply to the PA is a battery, such as in a cellular handset, for example.

One well-known approach to achieving high PA efficiency is to employ a type of RF transmitter known as a "polar transmitter," similar to as depicted in FIG. 1. The polar transmitter 100 comprises a digital signal processor (DSP) 102 and a polar modulator 104 including a phase modulator 106, a dynamic power supply (DPS) 108, and a switch-mode power amplifier (SMPA) 110. From an input digital message to be transmitted the DSP 102 generates polar-domain amplitude and phase modulating signals AM(t) and PM(t). The DPS 108 in the polar modulator 104 modulates a direct current (DC) power supply voltage VDD(DC) by the amplitude modulating signal AM(t) to produce a time-varying DPS voltage VDD(t), which is then applied to the power supply port of the SMPA 110. As the DPS 108 modulates the DC power supply voltage VDD(DC), the phase modulator 106 modulates an RF carrier by the phase modulating signal PM(t) to produce a constant-envelope phase-modulated RF carrier, which is applied to the RF input port of the SMPA 110. Because of its switch-mode operation the SMPA 110 produces an RF output that depends on the time-varying magnitude of the DPS voltage VDD(t) produced by the DPS 108. As the SMPA 110 translates the phase-modulated RF carrier to higher RF power it exploits this dependency to impress the amplitude modulation contained in the original input amplitude modulating signal AM(t) onto the final RF output $RF_{OUT}$, in other words, so that the final RF output $RF_{OUT}$ is then modulated in both phase and in amplitude.

Polar transmitters achieve high energy efficiency by virtue of the fact that the power transistors in their SMPAs are controlled to operate as switches, rather than as controlled current sources as in more conventional PAs (e.g., Class A, AB, B, C, Doherty and envelope tracking PAs). An ideal switch, when switched "on," allows current to flow through it but no voltage may drop across it and, when switched "off," a voltage may drop across it but no current can flow through it. Given that power dissipation $P_{diss}$ is determined by the product of voltage and current ($P_{diss}=V \times I$), SMPAs rely on these properties of an ideal switch to achieve high energy efficiency. Of course, in practice the power transistors do not actually behave as ideal switches, so the voltage and current waveforms at their outputs tend to overlap in time, resulting in the SMPAs operating less efficiently than desired. To address this problem RF engineers design reactive networks that "shape" the output current and voltage waveforms in a way that reduces the overlap.

The RF signal produced at the output of the SMPA 110 of the polar transmitter 100 has a rectangular-like waveform with sharp transitions. Usually, a low-pass filter (LPF) 112 is used to prevent harmonic components of the RF carrier from reaching the load 114 (typically an antenna), in other words, so that only the sinusoidal (fundamental) component of the RF carrier passes to the load 114. This approach is less energy efficient compared to the more conventional Class-E SMPA, which employs a high-Q series LC resonator to suppress harmonic components. However, it is more desirable from the standpoint that it affords the SMPA 110 the ability to operate effectively over a wider tuning range compared to the conventional Class-E SMPA and because it is more amenable to tuning than is a conventional Class-E SMPA. The tuning range is the range of carrier frequencies that an amplifier can operate.

The LPF 112 in the polar transmitter 100 is effective at passing the fundamental component of the RF carrier to the load 114. However, the harmonic components do not simply disappear. Rather, as explained in D. Babid et al., "*Importance and measurement of phase-stiffness in RF switching amplifiers,*" 2016 87th ARFTG Microwave Measurement Conference (ARFTG), IEEE, pp. 1-4, 2014, they are reflected back toward the output of the SMPA 110, whereupon arriving they undesirably interfere with the intended amplitude- and phase modulated RF carrier, disturbing its desired rectangular-like waveform and otherwise-sharp transitions. Constructive interference among the harmonic components and with the fundamental component can also result in large voltage pulses developing at the SMPA's power supply port. These large voltage pulses are undesirable since they not only distort the amplitude- and phase modulated RF carrier, but because they can also disrupt the intended operation of the DPS 108. Yet another problem with reflected harmonics appearing at the output of the SMPA 110 is that the RF power carried by harmonic components is dissipated primarily in the SMPA's power transistor(s). This additional dissipation causes the power transistor(s) to heat up to a greater degree than if no harmonics were present and, consequently, results in the power transistor(s) exhibiting a less than desired drain efficiency.

BRIEF SUMMARY OF THE INVENTION

A modulated RF carrier produced at the output of the polar transmitter's switch-mode power amplifier (SMPA) is conveyed to an output filter network comprising a harmonic low-pass filter (LPF) connected in parallel with an absorptive high-pass filter (HPF). Together the harmonic LPF and absorptive HPF pass the fundamental component of the modulated RF carrier to the polar transmitter's load while also absorbing higher harmonic components that would otherwise be undesirably reflected back toward the output of the SMPA.

Further features and advantages of the invention, including a detailed description of the above-summarized and other exemplary embodiments of the invention, will now be described in detail with respect to the accompanying drawings, in which like reference numbers are used to indicate identical or functionally similar elements.

BRIEF DESCRIPTION OF THE DRAWINGS

FIG. 7 is a drawing depicting the transfer characteristics of a prior art complementary output filter network; and FIG. 8 is a drawing depicting the transfer characteristics of a non-complementary output filter network that forms the output filter network of the polar transmitter depicted in FIG. 2, according to one embodiment of the present invention.

DETAILED DESCRIPTION

Figure 1:
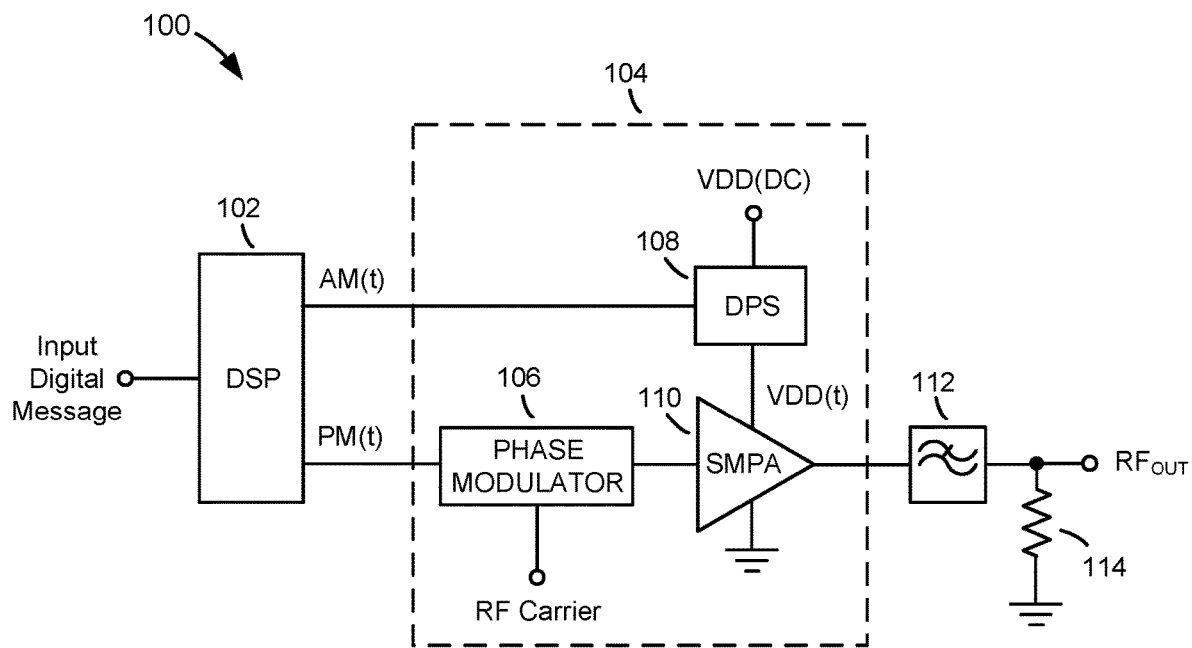
FIG. 1 is simplified block diagram of a prior art polar transmitter.
Figure 2:
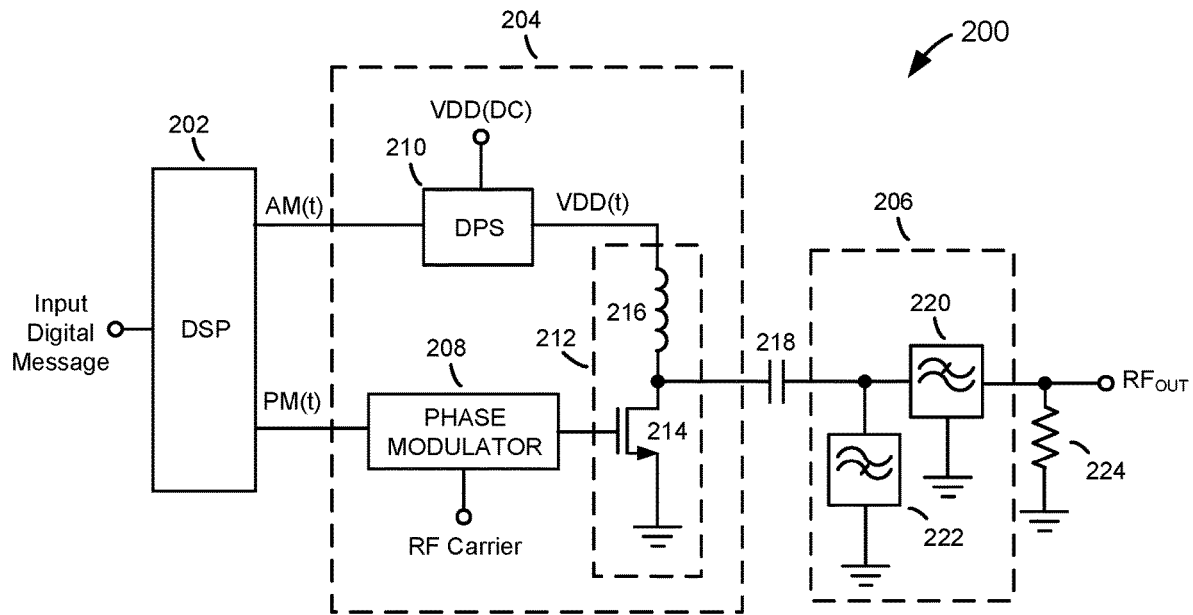
FIG. 2 is a block diagram of a polar transmitter, in accordance with one embodiment of the present invention.

Referring to FIG. 2, there is shown a block diagram depicting a polar transmitter 200 according to one embodiment of the present invention. The polar transmitter 200 comprises a digital signal processor (DSP) 202; a polar modulator 204; and a passive output filter network 206.

The DSP 202 operates similar to the DSP 102 of the prior art polar transmitter 100, producing an amplitude modulating signal AM(t), which is ultimately modulated onto the final modulated RF carrier $RF_{OUT}$, and a phase modulating signal PM(t).

The polar modulator 204 comprises a phase modulator 208, a dynamic power supply (DPS) 210, and a switch-mode power amplifier (SMPA) 212 that includes a power field-effect transistor power (FET) 214, for example, a gallium nitride (GaN) high electron mobility transistor (GaN HEMT), and an inductor 216 that is coupled between the output of the DPS 210 and the drain of the power FET 214 and that serves as both an RF choke and intermittently as an RF current source as the power FET 214 in the SMPA 212 is switched on and off.

The phase modulator 208 is responsible for modulating the phase modulation contained in the phase modulating signal PM(t) onto the RF carrier. The resulting constant-envelope phase-modulated RF carrier is applied to the gate of the power FET 214 of the SMPA 212.

The DPS 210 is responsible for modulating a direct current (DC) power supply voltage VDD(DC) by the amplitude modulating signal AM(t). The resulting DPS voltage VDD(t) is applied to the drain of the power FET 214 in the SMPA 212, via the SMPA's RF choke (inductor 216).

The SMPA 212 is responsible for both translating the phase-modulated RF carrier to higher RF power and modulating the amplitude of the resulting high-power phase-modulated RF carrier by the AM contained in the DPS voltage VDD(t). The constant-envelope phase-modulated RF carrier drives the gate of the power FET 214 in the SMPA 212, switching power FET 214 on and off, according to the phase modulation contained in the constant-envelope phase-modulated RF carrier, while the DPS voltage VDD(t) is applied to the drain of the power FET 214. Accordingly, as the SMPA 212 translates the phase-modulated RF carrier to higher RF power it also operates to impress the AM of the original amplitude modulating signal AM(t), now carried by the DPS voltage VDD(t), onto the SMPA's RF output. (It should be noted that in circumstances where the amplitude of the constant-envelope phase-modulated RF carrier is insufficient to drive the power FET between on and off states, a phase-path amplifier (not shown in FIG. 2) can be used to amplify the phase-modulated RF carrier prior to it being applied to the input (gate) of the power FET 214.)

The amplitude- and phase-modulated RF carrier produced by the SMPA 212 (i.e., at the output of the polar modulator 204) is conveyed to the output filter network 206 via a capacitor 218. The capacitor 218 serves both as a DC blocking capacitor and a charge transfer device between the SMPA's inductor 216 and the output filter network 206.

In accordance with one embodiment of the invention the passive output filter network 206 comprises a passive harmonic low-pass filter (LPF) 220 connected in parallel with a passive absorptive high-pass filter (HPF) 222. Together the LPF 220 and absorptive HPF 222 pass the fundamental frequency of the modulated RF carrier to the polar transmitter's load 224 while absorbing higher harmonics that would otherwise be, i.e., if not absorbed by the absorptive HPF 222, reflected back toward the output of the SMPA 212. (Note that for purposes of this disclosure the term "harmonic" refers to those frequencies that are non-unity positive integer multiples (n>1) of the fundamental frequency of the RF carrier, i.e., n={2, 3, 4, . . . }.) In one embodiment of the invention the absorptive HPF 222 is designed and configured so that it substantially absorbs the second harmonic and all higher harmonics, and in another is designed and configured so that it substantially absorbs the third and all other higher harmonics.

The load 224, which is not necessarily considered to be an actual component of the polar transmitter 200, comprises an antenna from which the filtered high-power amplitude- and phase-modulated RF carrier is radiated over the air to a remote receiver. At the fundamental frequency of the RF carrier, or over the spectral range the polar transmitter 200 emits its signals, the antenna 224 presents itself as a resistive load, for example, $Z_L=Z_0=50$ ohms, where $Z_0$ is the characteristic impedance of the transmission line that feeds the antenna 224, although, depending on the design, the antenna 224 may have some reactance present.

The LPF 220 can be implemented in various ways. In one embodiment of the invention it comprises a T-cell LPF 300 (i.e., "series first" LPF 300), like that depicted in FIG. 3. In another embodiment of the invention it comprises a π-cell LPF 400 (i.e., "shunt first" 400), like that depicted in FIG. 4.

Figures 3, 4:
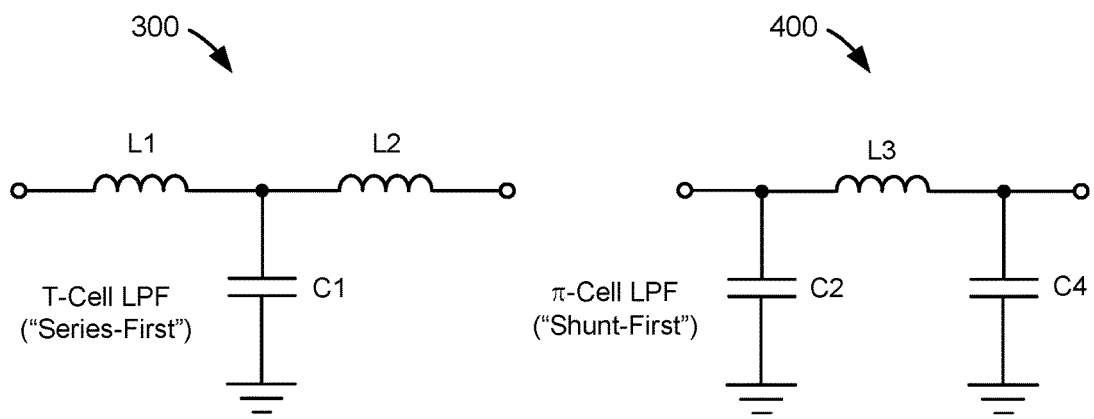
FIG. 3 is a schematic drawing of the low-pass filter (LPF) portion of the output filter network of the polar transmitter depicted in FIG. 2, according to one embodiment of the present invention.
FIG. 4 is a schematic drawing of the LPF portion of the output filter network of the polar transmitter depicted in FIG. 2, according to another embodiment of the present invention.
Figure 5:
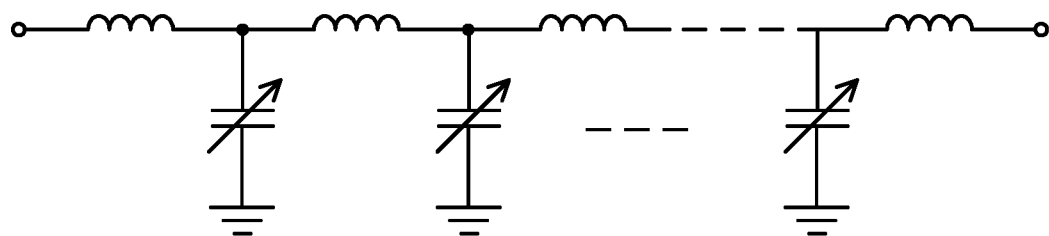
FIG. 5 is a schematic drawing of the LPF portion of the output filter network of the polar transmitter depicted in FIG. 2, revealing and highlighting the "ladder" effect that results when the LPF is implemented with an order greater than three.

The T-cell and π-cell LPFs 300 and 400 depicted in FIGS. 3 and 4 are third order passive-type LC filters and may be alternatively referred to as LC "ladder" filters due to the fact that their circuit diagrams resemble a ladder. This "ladder" effect can be more readily appreciated when either the T-cell LPF 300 or π-cell LPF is extended to an order greater than three, such as illustrated in FIG. 5.

According to one embodiment of the invention, one or more of the capacitors of the particular LPF chosen to serve as the LPF 220 in the output filter network 206 (e.g., T-cell LPF 300 or π-cell LPF 400) is/are tunable capacitor(s)-tunable RF microelectromechanical system (RF-MEMS) capacitor(s), specifically, in one particular exemplary embodiment of the invention.

It should be mentioned that although the exemplary embodiments of the passive LPF 220 described above employ either the third order order T-cell LPF 300 or the third order order π-cell LPF 400, the output filter network 206 is not restricted to using a third order LPF. Passive LPFs of other orders can be alternatively used. Further, the reactive component(s) of the LPF 220 may be selected, depending on the application or design requirements, so that the LPF 220 operates according to any "type" of filter, such as, for example, a Butterworth (maximally flat passband), Chebyshev (steepest roll-off), Bessel (lowest group delay), or Elliptic (balanced ripple in stopband and passband) LPF.

When conceiving and developing the present invention the inventors realized that when the SMPA 212 was terminated with just the T-cell LPF 300 (no absorptive HPF 222 present), the SMPA's inductor 216 would attempt to source a sudden large voltage spike from the T-cell LPF 300 upon the power FET 214 being switched from its on state to its off state. The SMPA's inductor 216 would behave in this manner in an effort to oppose the reduction in flux of its magnetic field (Lenz's law). Because the T-cell LPF 300 presents itself as a high impedance to sudden changes in current, large voltage spikes (v=L×di/dt) would then develop at the drain of the SMPA 212, potentially causing damage to the T-cell LPF 300 and/or components of the polar modulator 204. The inventors further realized that when the SMPA 212 was terminated with just the π-cell LPF 400 (again, with no absorptive HPF 222 present) a different but still significant problem presented itself, specifically, upon the power FET 214 being switched from its off state to its on state, high current and ringing, also having the deleterious effect of possibly damaging the π-cell LPF 400 and/or components of the polar modulator 204, could occur. To overcome these problems the inventors conceived the solution of connecting the absorptive HPF 222 in parallel with the LPF 220 (implemented using either the T-cell LPF 300 or π-cell LPF 400). Introducing the absorptive HPF 222 not only avoids the problem of the LPF 220 and/or components of the polar modulator 204 being damaged by voltage spikes or high currents, its presence in the output filter network 206 also provides the benefit of absorbing harmonics of the RF carrier that are reflected from the LPF 220 back toward the output of the SMPA 212, as well as other high-frequency RF energy that can be intercepted by the polar transmitter 200 from other nearby transmitters, such as may be the case when the polar transmitter 200 is employed in a phased array in close proximity to other RF transmitters, for example.

Figure 6:
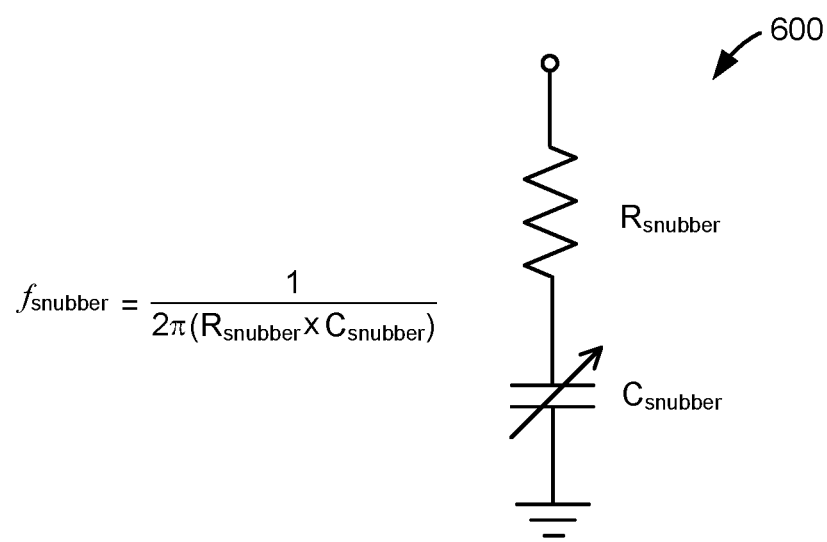
FIG. 6 is a schematic drawing of the absorptive high-pass filter (HPF) portion of the output filter network of the polar transmitter depicted in FIG. 2, according to one embodiment of the present invention.

FIG. 6 is a schematic diagram of one way the absorptive HPF 222 is implemented in one embodiment of the invention. The exemplary absorptive HPF 600 comprises a resistor $R_{snubber}$ connected in series with a capacitor $C_{snubber}$, thus forming a passive first order series-RC high-pass filter (HPF). When configured between the output of the SMPA 212 and the input of the LPF 220, the series absorptive HPF 600 operates akin to an RC snubber in a switch-mode power supply. The absorptive HPF 600 exhibits an impedance equal to $R_{snubber}$ at high frequencies, a very large impedance at low frequencies, and has a cut-off frequency $f_{snubber}=1/[2\pi(R_{snubber} \times C_{snubber})]$. In one embodiment of the invention employing the T-cell LPF 300 for the LPF 220, $R_{snubber}$ is selected to have a value substantially equal to the characteristic impedance $Z_0$, i.e., $R_{snubber}=Z_0$, and the product $R_{snubber} \times C_{snubber}$ is chosen so that harmonic components of the RF carrier (in particular the second harmonic component) are substantially suppressed but without resulting in the absorptive HPF 600 presenting itself as an unacceptably large insertion loss in the output filter network 206 over the transmission frequency band of interest.

The capacitor $C_{snubber}$ of the exemplary absorptive HPF 600 depicted in FIG. 6 may, though not necessarily, comprise a tunable capacitor, as indicated by the arrow through the capacitor symbol in FIG. 6, and in one particular embodiment comprises a tunable RF-MEMS capacitor. The capacitor(s) in the LPF 220 can also be tunable. For example, in one embodiment of the invention one or more capacitors making up the LPF 220 are tunable and one or more capacitors making up the absorptive HPF 222 are tunable. In another embodiment one or more of the capacitors in the absorptive HPF 222 is/are tunable but the capacitor(s) in the LPF 220 is/are not (i.e., is/are "fixed"). Finally, in yet another embodiment one or more of the capacitors in the LPF 220 is/are tunable but the capacitor(s) in the absorptive HPF 222 is/are not (i.e., is/are "fixed").

The exemplary absorptive HPF 600 depicted in FIG. 6 is a first order filter. However, a higher-order absorptive HPF could be used, instead. It should also be mentioned that like the LPF 220, the absorptive HPF 222 may comprise a filter of any type, including, for example, a Butterworth, Chebyshev, Bessel, or Elliptic HPF. The LPF 220 and absorptive HPFs 222 can be of the same type (for example, both Chebyshev filters) but insofar as the invention is concerned there is no requirement that they must be.

In some applications it is desirable for the passband of the LPF 220 to be as flat as possible. In such applications a Butterworth type LPF would be the immediate choice for implementing the LPF 220. However, there are circumstances where some amount of ripple is tolerable. For example, it may be that there is no great need for the transfer characteristics of the LPF 220 to be flat over the entire passband and some amount of ripple below a certain frequency is tolerable. In such a circumstance a different type of filter, other than a Butterworth, for example, a Chebyshev or Elliptic, could be used. Tolerating some amount of ripple can be particularly acceptable in circumstances where the LPF 220 is tunable since it more readily allows the position (in frequency) of a select maximum in the LPF transfer to be tuned. The same is true for the absorptive HPF 222, in other words, some amount of ripple may be tolerable since it affords the ability to tune the high-pass transfer characteristics in such a way that absorption at the fundamental frequency is minimized while absorption of a certain harmonic, for example, the second or third harmonic, is maximized.

In a practical implementation of the polar transmitter 200, the absorptive HPF 222 and LPF 220 are typically mounted on a printed circuit board (PCB) along with the other components of the polar modulator 204 (and possibly also the DSP 202), and transmission lines on the PCB are used to electrically interconnect the various components. To minimize back-and-forth reflections between the LPF 220 and absorptive HPF 222, in one embodiment of the invention the absorptive HPF 222 is mounted on the PCB so that it is in close proximity or as close as possible to the LPF 220 and closer to the passive LPF 220 than to the output of the polar modulator 204 (i.e., to the output of the SMPA 212).

In various embodiments of the invention the filter order of the LPF 220 is different from (i.e., is not the same as) the filter order of the absorptive HPF 222; in other words the LPF 220 has a first filter order, the absorptive HPF 222 has a second filter order, and the first filter order is greater than the second filter order, similar to as described above where the LPF 220 comprises a third order LPF (specifically, one of the third order T-cell 300 or π-cell 400 LPFs depicted in FIGS. 3 and 4) and the absorptive HPF 222 comprises the first order absorptive HPF 600 depicted in FIG. 6. However, it should be emphasized that it is not a necessary requirement that the LPF 220 and absorptive HPF 222 have different filter orders. For example, in some embodiments of the invention the LPF 220 and absorptive HPF 222 is each a first, second, third, (or higher) order filter, and together form what may be referred to as a "non-complementary" output filter network, as opposed to the "complementary" ladder filters described in A. Brizić et al., "*Constant-Resistance Filters with Diplexer Architecture for S-Band Applications,*" 42nd International Convention on Information and Communication Technology, Electronics and Microelectronics, MIPRO, 2019. The principal difference between the "complementary" and "non-complementary" ladder filter configurations can be best understood by comparing the transfer characteristics of a typical prior art complementary ladder filter (FIG. 7) to the transfer characteristics of a non-complementary filter (FIG. 8). As can be seen, whereas the transmission magnitudes $|S_{21}|^2$ and $|S_{31}|^2$ of the LPF and HPF sections of the complementary filter (FIG. 7) have the same corner frequency $\omega_C(\text{LPF})=\omega_C(\text{HPF})$ (same angular frequency at half-power (−3 dB) point), the transmission magnitudes $|S_{21}|^2$ and $|S_{31}|^2$ of the LPF and HPF sections of the non-complementary filter (FIG. 8) do not, in other words, $\omega_C(\text{LPF})\neq\omega_C(\text{HPF})$.

Finally, it should be mentioned that although the exemplary absorptive HPF 600 (FIG. 6) used to implement the absorptive HPF 222 section of the output filter network 206 is an RC network, in another embodiment of the invention it comprises a high-order absorptive RLC network exhibiting maximal transmission and minimal reflection of the fundamental component of the modulated RF carrier while also exhibiting minimal transmission and minimal reflection of the second harmonic. And in another embodiment of the invention the absorptive HPF 222 is designed to not only minimize transmission and reflection of the second harmonic but also to minimize transmission of the third harmonic.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

The invention claimed is:

1. A polar transmitter, comprising:
a polar modulator having a switch-mode power amplifier (SMPA) configured to produce a modulated radio frequency (RF) carrier; and
an output filter network coupled to an output of the polar modulator, the output filter network including a low-pass filter (LPF) having a first filter order connected in parallel with an absorptive high-pass filter (HPF) having a second filter order,
wherein the first filter order and second filter order are different.

2. The polar transmitter of claim 1, wherein the first filter order is greater than the second filter order.

3. The polar transmitter of claim 1, wherein the LPF comprises a passive LC ladder filter.

4. The polar transmitter of claim 3, wherein the passive LC ladder filter comprises a third-order T-cell LPF.

5. The polar transmitter of claim 3, wherein the passive LC ladder filter comprises a third-order π-cell LPF.

6. The polar transmitter of claim 1, wherein the absorptive HPF comprises a first order series-RC filter and the LPF comprises a passive LC ladder filter.

7. The polar transmitter of claim 1, wherein the absorptive HPF is located in close proximity to the LPF and closer to the LPF than to an output of the SMPA.

8. The polar transmitter of claim 1, wherein the LPF is a first type of filter and the absorptive HPF is a second type of filter different from the first type.

9. The polar transmitter of claim 8, wherein the first and second types of filters are selected from the group consisting of Butterworth, Chebyshev, Bessel, and Elliptic filter types.

10. The polar transmitter of claim 1, wherein the absorptive HPF is a first order series-RC filter and the LPF comprises a second order or higher LC ladder filter.

11. A polar transmitter, comprising:
a polar modulator having a switch-mode power amplifier (SMPA) configured to produce a modulated radio frequency (RF) carrier; and
a passive output filter network coupled to an output of said polar modulator, said passive output filter network comprising a low-pass filter (LPF) connected in parallel with an absorptive high-pass filter (HPF),
wherein the LPF and absorptive HPF together comprise a non-complementary ladder filter, the LPF has a first filter order, the absorptive HPF has a second filter order, and the first filter order is different from the second filter order.

12. The polar transmitter of claim 11, wherein the first filter order is greater than the second filter order.

13. The polar transmitter of claim 11, wherein the absorptive HPF is a first order series-RC filter and the LPF comprises a second order or higher LC ladder filter.

14. A method of filtering a modulated radio frequency (RF) carrier signal produced by a polar modulator, comprising:
passing a fundamental component of the modulated RF carrier to a load using a low-pass filter (LPF) having a first filter order; and
absorbing a harmonic component of the modulated RF carrier signal reflected from the LPF toward an output of the polar modulator using an absorptive high-pass filter (HPF) having a second filter order different from the first filter order.

15. The method of claim 14, wherein the first filter order is greater than the second filter order.

16. The method of claim 14 wherein the LPF comprises a passive LC ladder filter.

17. The method of claim 16, wherein the passive LC ladder filter comprises a third-order T-cell LPF.

18. The method of claim 16, wherein the passive LC ladder filter comprises a third-order π-cell LPF.

19. The method of claim 14, wherein the absorptive HPF comprises a first order series-RC filter and the LPF comprises a passive LC ladder filter.

20. The method of claim 14, wherein the absorptive HPF is located in close proximity to the LPF and closer to the LPF than to an output of the polar modulator.

21. The method of claim 14, wherein the LPF is a first type of filter and the absorptive HPF is a second type of filter different from the first type.

22. The method of claim 21, wherein the first and second types of filters are selected from the group consisting of Butterworth, Chebyshev, Bessel, and Elliptic filter types.

23. The method of claim 14, wherein the absorptive HPF is a first order series-RC filter and the LPF comprises a second order or higher LC ladder filter.

24. A method of filtering a modulated radio frequency (RF) carrier signal produced by a polar modulator, comprising:
   passing a fundamental component of the modulated RF carrier to a load using a low-pass filter (LPF) having a first filter order; and
   absorbing a harmonic component of the modulated RF carrier signal reflected from the LPF toward an output of the polar modulator using an absorptive high-pass filter (HPF),
   wherein the LPF has a corner frequency different from a corner frequency of the absorptive HPF, the LPF has a first filter order, the absorptive HPF has a second filter order and the first filter order is different from the second filter order.

25. The method of claim 24, wherein the first filter order is greater than the second filter order.

26. A polar transmitter, comprising:
   a polar modulator having a switch-mode power amplifier (SMPA) configured to produce a modulated radio frequency (RF) carrier; and
   an output filter network coupled to an output of the polar modulator, the output filter network including a low-pass filter (LPF) of a first filter type connected in parallel with an absorptive high-pass filter (HPF) of a second filter type,
   wherein the first filter type and second filter type are different and are selected from the group consisting of Butterworth, Chebyshev, Bessel, and Elliptic filter types.

27. A polar transmitter, comprising:
   a polar modulator having a switch-mode power amplifier (SMPA) configured to produce a modulated radio frequency (RF) carrier; and
   a passive output filter network coupled to an output of said polar modulator, said passive output filter network comprising a low-pass filter (LPF) connected in parallel with an absorptive high-pass filter (HPF),
   wherein the LPF and absorptive HPF together comprise a non-complementary ladder filter, the LPF is a first type of filter and the absorptive HPF is a second type of filter different from the first type, and the first and second types of filters are selected from the group consisting of Butterworth, Chebyshev, Bessel, and Elliptic filter types.

28. A method of filtering a modulated radio frequency (RF) carrier signal produced by a polar modulator, comprising:
   passing a fundamental component of the modulated RF carrier to a load using a low-pass filter (LPF) having a first filter order; and
   absorbing a harmonic component of the modulated RF carrier signal reflected from the LPF toward an output of the polar modulator using an absorptive high-pass filter (HPF),
   wherein the LPF has a corner frequency different from a corner frequency of the absorptive HPF, the absorptive HPF is a first order series-RC filter, and the LPF comprises a second order or higher LC ladder filter.

29. A polar transmitter, comprising:
   a polar modulator having a switch-mode power amplifier (SMPA) configured to produce a modulated radio frequency (RF) carrier; and
   an output filter network coupled to an output of the polar modulator, the output filter network including a low-pass filter (LPF) of a first filter type connected in parallel with an absorptive high-pass filter (HPF) of a second filter type,
   wherein the first filter type and second filter type are different, and wherein the LPF has a first filter order, the absorptive HPF has a second filter order, and the first and second filter orders are different.

30. A polar transmitter, comprising:
   a polar modulator having a switch-mode power amplifier (SMPA) configured to produce a modulated radio frequency (RF) carrier; and
   an output filter network coupled to an output of the polar modulator, the output filter network including a low-pass filter (LPF) of a first filter type connected in parallel with an absorptive high-pass filter (HPF) of a second filter type,
   wherein the first filter type and second filter type are different, the absorptive HPF is a first order series-RC filter, and the LPF comprises a second order or higher LC ladder filter.

* * * * *